United States Patent
Kim et al.

(10) Patent No.: US 7,602,253 B2
(45) Date of Patent: Oct. 13, 2009

(54) ADAPTIVE BANDWIDTH PHASE LOCKED LOOP WITH FEEDFORWARD DIVIDER

(75) Inventors: Jaeha Kim, Mountain View, CA (US); Deog-Kyoon Jeong, Seoul (KR)

(73) Assignee: Silicon Image, Inc., Sunnyvale, CA (US)

( * ) Notice: Subject to any disclaimer, the term of this patent is extended or adjusted under 35 U.S.C. 154(b) by 0 days.

(21) Appl. No.: 11/637,254

(22) Filed: Dec. 11, 2006

(65) Prior Publication Data

US 2008/0136531 A1   Jun. 12, 2008

(51) Int. Cl.
   *H03L 7/00* (2006.01)
(52) U.S. Cl. .................. 331/2; 331/16; 331/34; 331/177 R; 331/46; 327/156; 375/376
(58) Field of Classification Search ............ 331/2, 331/46, 49, 16, 34, 177 R; 327/156; 375/376
   See application file for complete search history.

(56) References Cited

U.S. PATENT DOCUMENTS

| | | | |
|---|---|---|---|
| 5,610,558 A * | 3/1997 | Mittel et al. ............ | 331/2 |
| 6,281,727 B1 | 8/2001 | Hattori | |
| 6,670,833 B2 | 12/2003 | Kurd et al. | |
| 6,762,634 B1 | 7/2004 | Hattori | |
| 6,812,797 B1 | 11/2004 | De Veirman et al. | |
| 7,006,590 B2 | 2/2006 | Skierszkan et al. | |
| 2001/0008384 A1 | 7/2001 | Ku | |
| 2005/0135526 A1 | 6/2005 | Miller et al. | |
| 2005/0182983 A1 | 8/2005 | Gaskins et al. | |

FOREIGN PATENT DOCUMENTS

| | | |
|---|---|---|
| EP | 1544717 | 6/2005 |
| GB | 2295930 | 6/1996 |
| JP | 60197015 | 10/1985 |

OTHER PUBLICATIONS

S. Sidiropoulos, et al., Adaptive Bandwidth DLLs and PLLs Using Regulated Supply CMOS Buffers, 2000 Symp. On VLSI Circuits Digest of Papers, Jun. 2000, pp. 124-127.
J.G. Maneatis, et al., Self-biased, High-Bandwidth, Low-Jitter 1-to-4096 Multiplier Clock-Generator PLL, IEEE J. of Solid-State Circuits Digest of Papers, vol. 38, No. 11, Nov. 2003, pp. 1795-1803.
T. H. Lin et al., A 900-MHz 2.5-mA CMOS frequency synthesizer with an automatic SC tuning loop, IEEE J. of Solid-State Circuits, vol. 36, No. 3, Mar. 2001, pp. 424-431.

(Continued)

*Primary Examiner*—Arnold Kinkead
(74) *Attorney, Agent, or Firm*—Blakely Sokoloff Taylor & Zafman

(57) ABSTRACT

In some embodiments, a chip includes first and second sub phase lock loops (sub-PLLs) including first and second voltage controlled oscillators (VCOs) to provide first and second VCO output signals and first and second feedforward divider circuits to divide first and second frequencies of the first and second VCO output signals by first and second division factors. The chip also includes phase locked loop control circuitry to select the first and second division factors. Other embodiments are described and claimed.

25 Claims, 7 Drawing Sheets

OTHER PUBLICATIONS

E. Alon, et al., Replica Compensated Linear Regulators for Supply-Regulated Phase-Locked Loops, IEEE J. of Solid-State Circuits, vol. 41, No. 2, Feb. 2006, pp. 413-424.

J. Kim, et al., A 20-GHz Phase-Locked Loop for 40Gb/s Serializing Transmitter in 0.13μm CMOS, 2005 Symp. On VLSI Circuits Digest of Papers, Jun. 2005, pp. 144-147.

J. Kim, Powerpoint presentation given to Samsung Electronics, Inc., May 2005, "Design of CMOS Adaptive Bandwidth PLLs/DLLs." 51 pages.

"8029P010EP EP Search Report Mailed Feb. 18, 2008 for EP Application 07254315.0-2206", (Feb. 18, 2008), Whole Document.

"8029P010EP OA mailed Dec. 15, 2008 for EP Application 07254315.0-2206", (Dec. 15, 2008), Whole Document.

Kim, Jaeha, et al., "Circuit Techniques for a 40Gb/s Transmitter in 0.13μm CMOS", *ISSCC 2005/Session 8/Circuits for High-Speed Links and Clock-Generators/8.1*, 2005 IEEE International Solid-State Circuits Conference, (2005), 150, 151 and 589.

* cited by examiner

US 7,602,253 B2

ADAPTIVE BANDWIDTH PHASE LOCKED LOOP WITH FEEDFORWARD DIVIDER

FIELD

Embodiments of the inventions relate generally to phase locked loops.

BACKGROUND

Phase locked loops (PLLs) are commonly used in integrated circuit chips and systems to generate a signal that has a frequency and phase related to an input signal, called a reference signal. The reference signal is typically a clock signal. The output signal of the PLL is typically also a clock signal that is "locked" to the input reference clock signal. PLLs are used in a wide variety of chips including microprocessor, communications, and other electronics.

A typical PLL includes a phase frequency detector (PFD), a charge pump (CP), a loop filter (LF) (which may be a low-pass filter), a voltage controlled oscillator (VCO), and frequency divider circuit. The PFD compares the phase of the reference signal with a feedback signal from the frequency divider circuit. Depending on the relationship of the phase of the reference signal and the feedback signal, the PFD provides a signal(s) to the CP that instructs the CP to increase or decrease the voltage to the VCO through the LF. The LF may integrate the signal to smooth it. The smoothed signal is provided to the VCO. The frequency of the VCO increases or decreases depending on the voltage signal from the LF. The output of the VCO is fed back to the PFD through the frequency divider in a loop that causes the output signal of the VCO to have a frequency that is proportional to (or equal to) and in phase with the reference signal.

Many PFDs can respond to frequency differences, which increases the lock-in range of allowable inputs. Some PLLs include a divider circuit between a reference clock signal and the reference input to the phase detector. In some designs, there are two outputs of the PFD: one with an up signal that causes the CP to increase the voltage to the VCO and another with a down signal that causes the CP to decrease the voltage to the VCO.

Adaptive-bandwidth PLL refers to a class of PLL that scales its dynamics proportionally with the operating frequency largely regardless of the process, voltage, and temperature (PVT) variations.

One of the challenges that analog PLL designers face today is the reduction in the ring VCO frequency range. The usable range of the VCO control voltage has shrunk considerably as the supply voltage has scaled below 1.2V (volts). On the other hand, the PLL application space continues to expand, demanding even wider frequency range from a single PLL.

SUMMARY

In some embodiments, a chip includes first and second sub phase lock loops (sub-PLLs) including first and second voltage controlled oscillators (VCOs) to provide first and second VCO output signals and first and second feedforward divider circuits to divide first and second frequencies of the first and second VCO output signals by first and second division factors. The chip also includes phase locked loop control circuitry to select the first and second division factors.

In some embodiments, the PLL control circuitry selects the first and second division factors in response to the first and second output clock signals and the first and second feedfoward voltage signal inputs into the first and second VCOs.

In some embodiments, a method includes providing first and second voltage controlled oscillators (VCOs) of first and second sub phase lock loops (sub-PLLs) with voltage control signals. The method further includes outputting first and second VCO output signals and first and second feedforward divider circuits from the first and second VCOs, dividing first and second frequencies of the first and second VCO output signals by first and second division factors, and selecting the first and second division factors.

In further embodiments, a chip includes at least one conductor carrying an input clock signal and a dual phase locked loop (dual-PLL). The dual-PLL includes first and second sub phase lock loops (sub-PLLs) including first and second voltage controlled oscillators (VCOs) to provide first and second VCO output signals and first and second feedforward divider circuits to divide first and second frequencies of the first and second VCO output signals by first and second division factors; and phase locked loop control circuitry to select the first and second division factors.

Other embodiments are described and claimed.

BRIEF DESCRIPTION OF THE DRAWINGS

The inventions may be understood by referring to the following description and accompanying drawings that are used to illustrate embodiments of the invention. However, the inventions are not limited to the details of these drawings.

DETAILED DESCRIPTION

In some embodiments, the inventions involves an adaptive-bandwidth PLL with a wide frequency range. Merely as an example, in some implementations, the frequency range is 500:1, but it could be another ratio. In some embodiments, the frequency range is extended with a dual-PLL architecture that dynamically adjusts the division factor of a feedforward divider.

Figure 1:
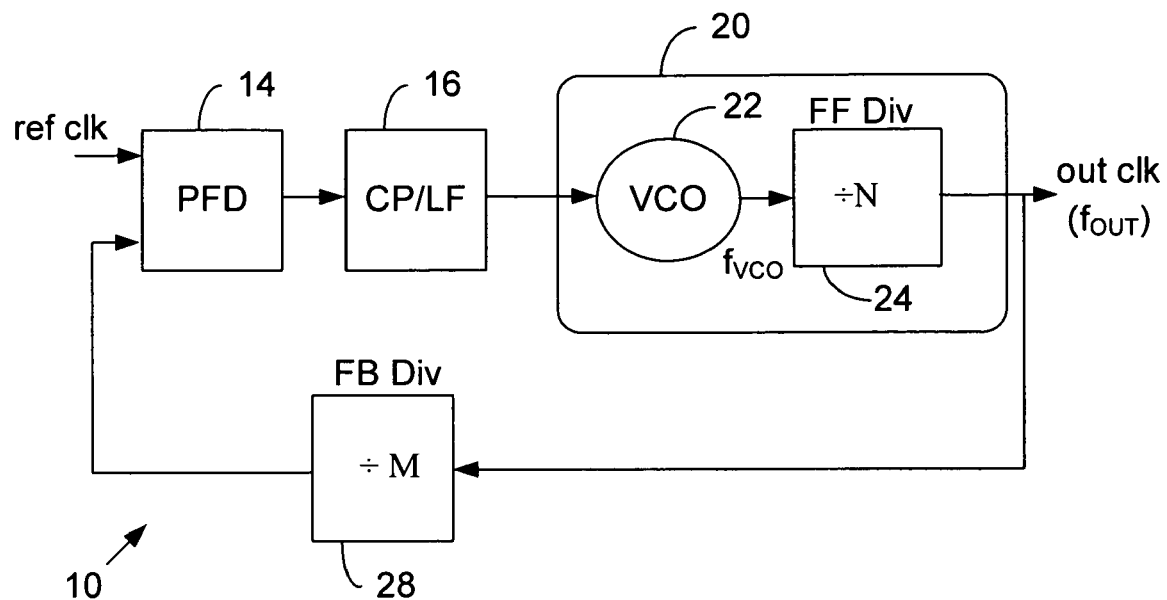
FIG. 1 is a block diagram representation of a system including a phase locked loop with components that may be used in some embodiments of the invention.

FIG. 1 illustrates a PLL 10 with a phase frequency detector (PFD) 10, a charge pump (CP)/loop filter (LF) 16 and output frequency control circuit 20 including a voltage control oscillator (VCO) 22 and a feedforward frequency divider (FF Div) 24 with a division factor of N, and a feedback frequency divider (FB Div) 28 with a division factor of M. VCO 22 provides a VCO signal with a frequency $f_{VCO}$. FF Div 24 provides an output clock signal (out clk) with a frequency $f_{OUT}$ that is also provided to FB Div 28. The output of FB Div 28 is provided as an input to PFD 14. The charge pump and loop filter of CP/LF 16 are different circuits but for convenience of illustration are combined. The division factor (N) of FF Div 24 is adjusted. In some embodiments, this adjustment allows FF Div 24 to generate a wide range of frequencies even if the VCO tuning range is relative narrow.

Figure 2:
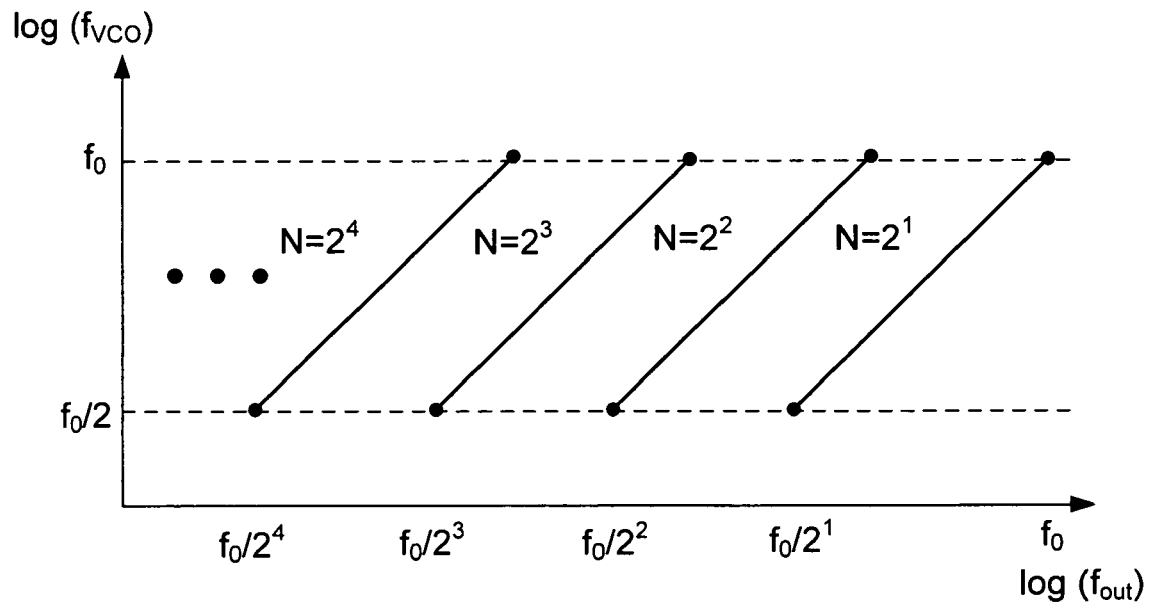
FIG. 2 is a graphical representation of lines of log $f_{VCO}$ versus log $f_{OUT}$ for different values of division factor N.

FIG. 2 illustrates a graph of lines of log $f_{VCO}$ versus log $f_{OUT}$ for different values of division factor N, for example, $N=2^4$, $N=2^3$, $N=2^2$, $N=2^1$. As the frequency of $f_{VCO}$ increases between $f_O$ and $f_O/2$, the frequency of $f_{OUT}$ increases beginning at $f_O/2^4$ for $N=2^4$, beginning at $f_O/2^3$ for $N=2^3$, beginning at $f_O/2^2$ for $N=2^2$, and beginning at $f_O/2^1$ for $N=2^1$. Note that the frequency lines may overlap such that of the highest frequency of one line (for example, the $N=4^4$ line) may be more than the lowest frequency of the next line (for example, the $N=2^3$ line).

Figure 3:
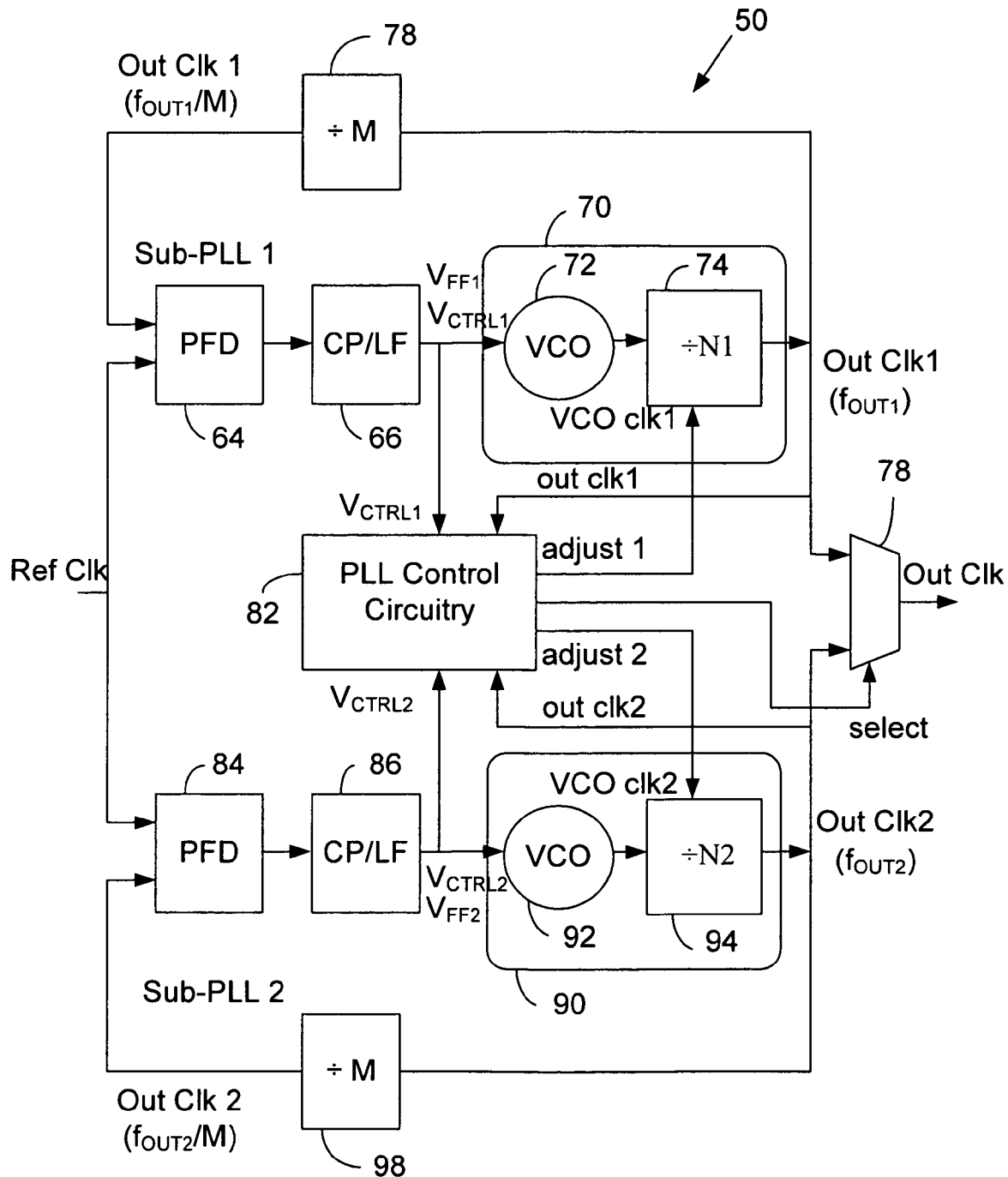
FIG. 3 is a block diagram representation of a dual phase locked loop according to some embodiments of the invention.
Figure 4:
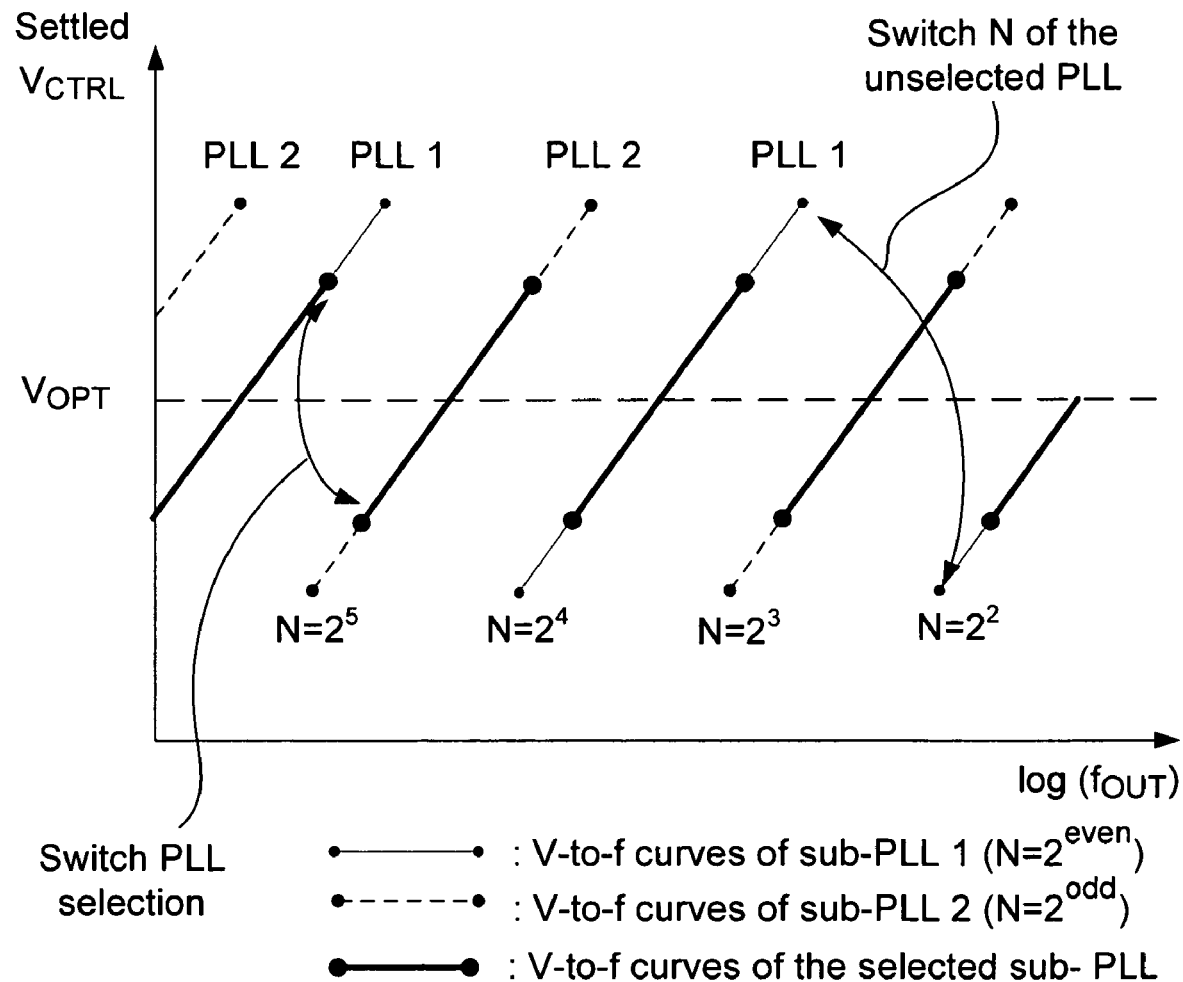
FIG. 4 is a graph of lines of log $f_{CTRL}$ versus log $f_{OUT}$ for different values of division factor N.

FIG. 3 illustrates a dual-PLL circuit 50 including two PLLs, sub-PLL 1 and sub-PLL 2, each of which is similar to PLL 10 in FIG. 1. In sub-PLL 1, PFD 64 receives the reference clock signal (ref clk) and the output of feedback frequency divider 78, which divides the frequency $F_{OUT1}$ of out clk1 by M. PFD 64 provides a signal(s) to CP/LF 66, which provides a voltage signal $V_{CTRL1}$ and a voltage signal $V_{FF1}$ to VCO 72 of output frequency control circuit 70. The signal VCO clk 1 is the output of VCO 72 and it is provided to feedforward frequency divider circuit 74, which divides the VCO clk1 signal by N1, where N1 is variable as, for example, is shown in FIGS. 2 and 4. The output clock signal (out clk 1) is the divided VCO clk1 signal and it is provided to selected circuit 78.

In sub-PLL 2, PFD 84 receives the reference clock signal (ref clk) and the output of feedback frequency divider 98, which divides the frequency $F_{OUT2}$ of out clk1 by M. PFD 84 provides a signal(s) to CP/LF 86, which provides a voltage signal $V_{CTRL2}$ and a voltage signal $V_{FF2}$ to VCO 82 of output frequency control circuit 90. The signal VCO clk 2 is the output of VCO 92 and it is provided to feedfoward frequency divider circuit 94, which divides the VCO clk2 signal by N2, where N2 is variable as, for example, is shown in FIGS. 2 and 4. The output clock signal (out clk 2) is the divided VCO clk2 signal and it is provided to selected circuit 78.

PLL control circuitry 82 selects the value of N1 and N2 and also provides a selection signal to selection circuit 78 to control whether out clk 1 or out clk 2 is provided by selection circuit 78 as the output signal. In some embodiments, N1 equals N2 and in other embodiments, N1 and N2 may be different. In some embodiments, PLL control circuitry 82 receives the $V_{CTRL1}$ and $V_{CTRL2}$ and the output clock signals out clk 1 and out clk 2 to help with the decisions. In other embodiments, PLL control circuitry 82 receives the VCO clk1 and VCO clk2 signals.

In FIG. 3, the frequency range may be extending through the feedforward divider circuits 74 and 94. When a low-frequency $f_{OUT}$ is needed, dividers 74 and 94 scale down the VCO frequency ($f_{VCO}$) by N1 or N2, instead of letting VCO 72 and 92 oscillate at the low $f_{OUT}$. As mentioned, PLL control circuitry 82 selects N1 and N2. In some embodiments, the problem of selection is similar to the coarse frequency control problem encountered in LC oscillators with digitally-selectable load capacitors. A prior art scheme involves choosing an N that places the VCO control voltage ($V_{CTRL}$) between the high- and low-limits provided externally ($V_H$ and $V_L$). However, this scheme may be unsuitable for ring oscillators because they are more sensitive to PVT variations than LC oscillators. First, to ensure seamless coverage of frequency, the external limits $V_H$ and $V_L$ may be set with conservative margins to guarantee sufficient overlap between the adjacent frequency sub-ranges. Second, since changing N may cause the PLL to lose lock momentarily, the selection of N may be made only once at start-up and may be made prudently, with enough margins to accommodate the worst possible PVT variation over time. These margins call for a wide tuning range of the VCO, diminishing the benefits of the feedforward divider circuits 74 and 94.

The proposed dual-PLL circuitry (such as in FIG. 3) may eliminate the need for those margins by allowing N to change dynamically and using a single voltage $V_{OPT}$ to set the mid level of $V_{CTRL}$. As depicted in FIG. 3, dual-PLL 50 includes two sub-PLLs 1 and 2 with different feedforward division factors N1 and N2. One sub-PLL drives the output (out clk) through selection circuit 78 while the other searches for a better N. If the latter does find a better N, it takes over the role of driving the output and the former starts a new search for N. Since only the locked sub-PLL drives the output, the transients from switching N are hidden from the output and the division factor N can change in real-time. The optimality of N is assessed by how close the settled $V_{CTRL}$ is to $V_{OPT}$ and thus the range of $V_{CTRL}$ in use will be centered at $V_{OPT}$, without having to set $V_H$ and $V_L$. Therefore, the aforementioned margins required in the previous scheme are no longer needed. In addition, the mid-$V_{CTRL}$ level $V_{OPT}$ can be designed to track the PVT conditions of the VCO to always place it in the optimal $V_{CTRL}$-range for the lowest jitter.

FIG. 4 illustrates an algorithm to find N1 and N2. Merely as an example, in some embodiments, the VCO-divider pair can generate a wide range of $f_{OUT}$ with a narrow $f_{VCO}$ range of 2:1, assuming that the division factor N takes the powers of 2, although other embodiments are not limited to these details. FIG. 4 illustrates a graph of lines of settled $f_{CTRL}$ versus log $f_{OUT}$ for different values of division factor N, for example, $N=2^6$, $N=2^5$, $N=2^4$, $N=2^3$, $N=2^2$, $N=2^1$. "Settled" refers to the PLL being settled or locked. FIG. 4 three types of co-linear lines. A solid thin line indicates $V_{CTRL}$ versus $f_{OUT}$ characteristics of sub-PLL 1 for N values equal to $2^{even}$. A dashed thin line indicates $V_{CTRL}$ versus $f_{OUT}$ characteristics of sub-PLL 2 for N values equal to $2^{odd}$. A solid thick line indicates $V_{CTRL}$ versus $f_{OUT}$ characteristics of the selected PLL (sub-PLL 1 or sub-PLL 2) Like in FIG. 2, the frequency lines may overlap such that of the highest frequency of one line may be more than the lowest frequency of the next line. However, the upper end (large dark circle) of a heavy line is directly above the lowest end (small circle) of the next line. For example, the small circle at the bottom of line $N=2^4$ has the same $f_{OUT}$ value as the top (large circle) of the heavy line of $N=2^5$.

The sub-PLL with the settled $V_{CTRL}$ closer to the $V_{OPT}$ drives the output. The driving sub-PLL is changed when the two $V_{CTRL}$'s have equal distances to $V_{OPT}$, that is, when the two sub-PLLs are equally optimal to generate $f_{OUT}$. Upon the switch, the output phase may experience a shift due to the difference in static phase offsets. A hysteresis may be added to prevent this phase shift from turning into a high-frequency jitter via chattering. Also, when both $V_{CTRL}$'s are higher or lower than $V_{OPT}$, one of them is deemed too far from $V_{OPT}$ and the unselected sub-PLL may update N by a factor 4 to bring it closer. The bandwidth of PLL 50 may vary proportionally with $f_{VCO}/(N \times M)$, where N×M is the total division factor. There are different ways to choose the value of $V_{OPT}$. The precise value of $V_{OPT}$ may not be important but discontinuities in frequency should be avoided. That means in FIG. 4, there should not be substantial space between the upper end (large dark circle) of a heavy line is directly above the lowest end (small circle) of the next line.

In some embodiments, PLL control circuitry 82 enables dynamic and glitch-free switching of the division factor. In some embodiments, by leveraging a relatively narrow tuning range, PLL 50 can achieve low jitter by operating the VCO in its best condition only. Also, with the loop bandwidth explicitly controlled by the division factor N, PLL 50 may maintain a more accurate adaptive-bandwidth dynamic than previous implementations.

Figure 5:
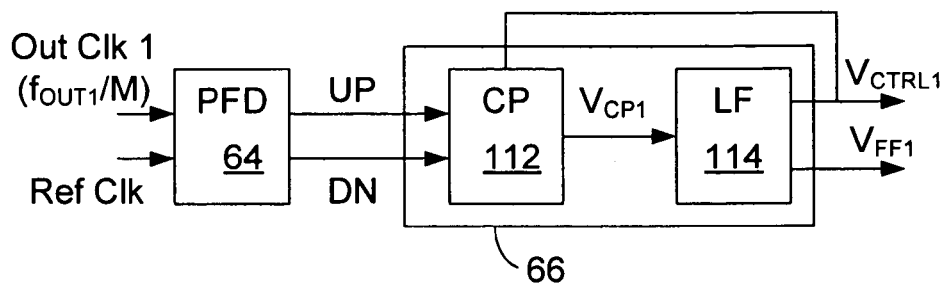
FIG. 5 is a block diagram representation of a phase frequency detector, charge pump, and loop filter that may be used in some embodiments of the invention.
Figure 6:
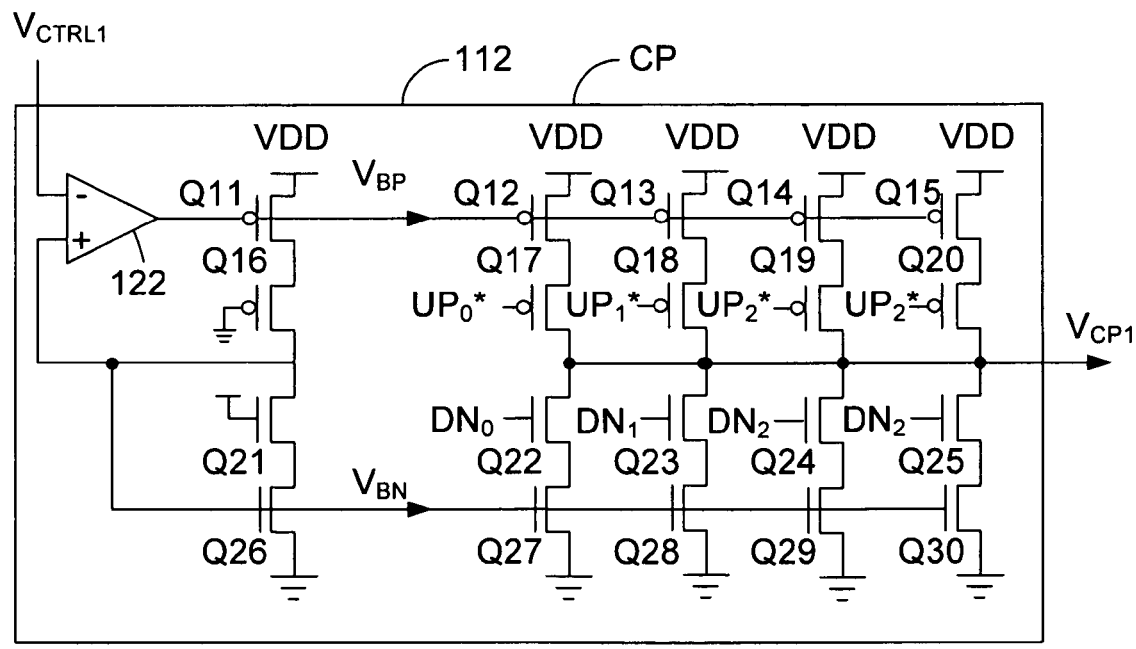
FIG. 6 is a block diagram representation of the charge pump of FIG. 5.
Figure 7:
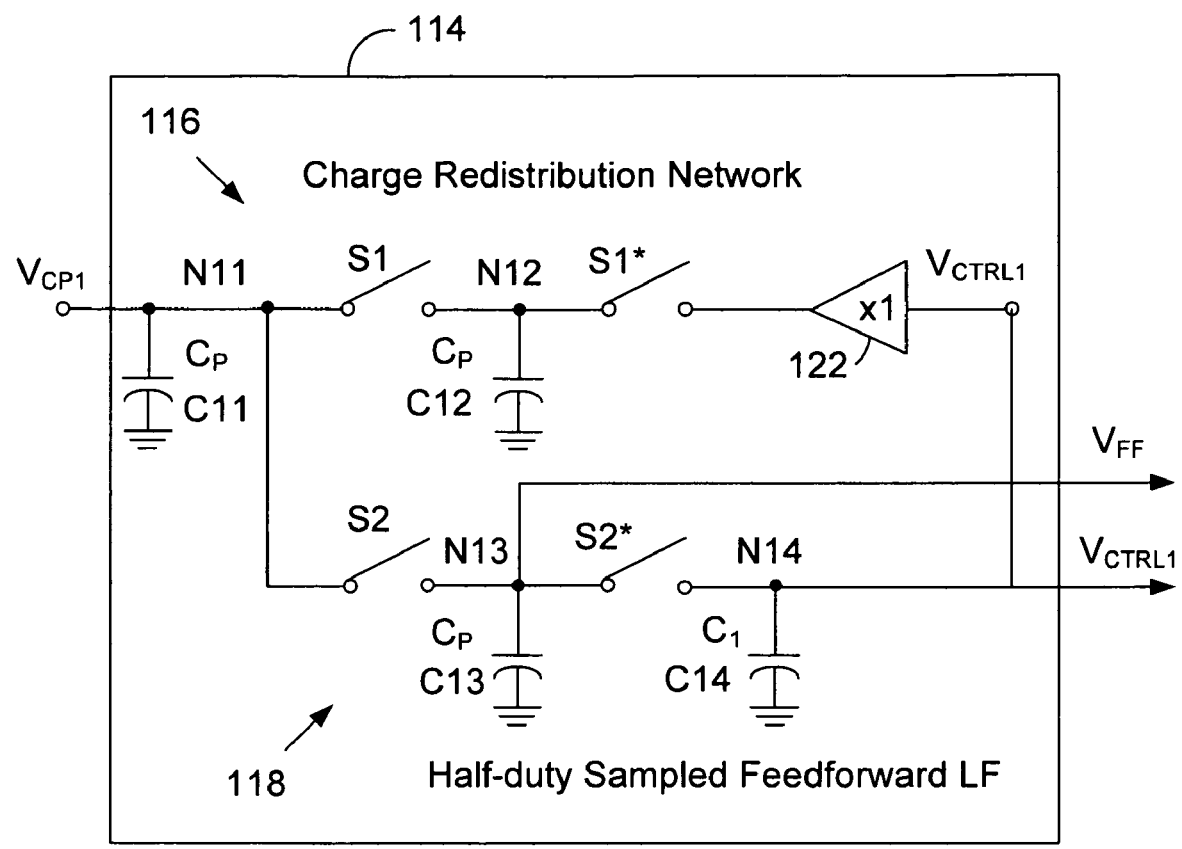
FIG. 7 is a block diagram representation of the loop filter of FIG. 5.
Figure 8:
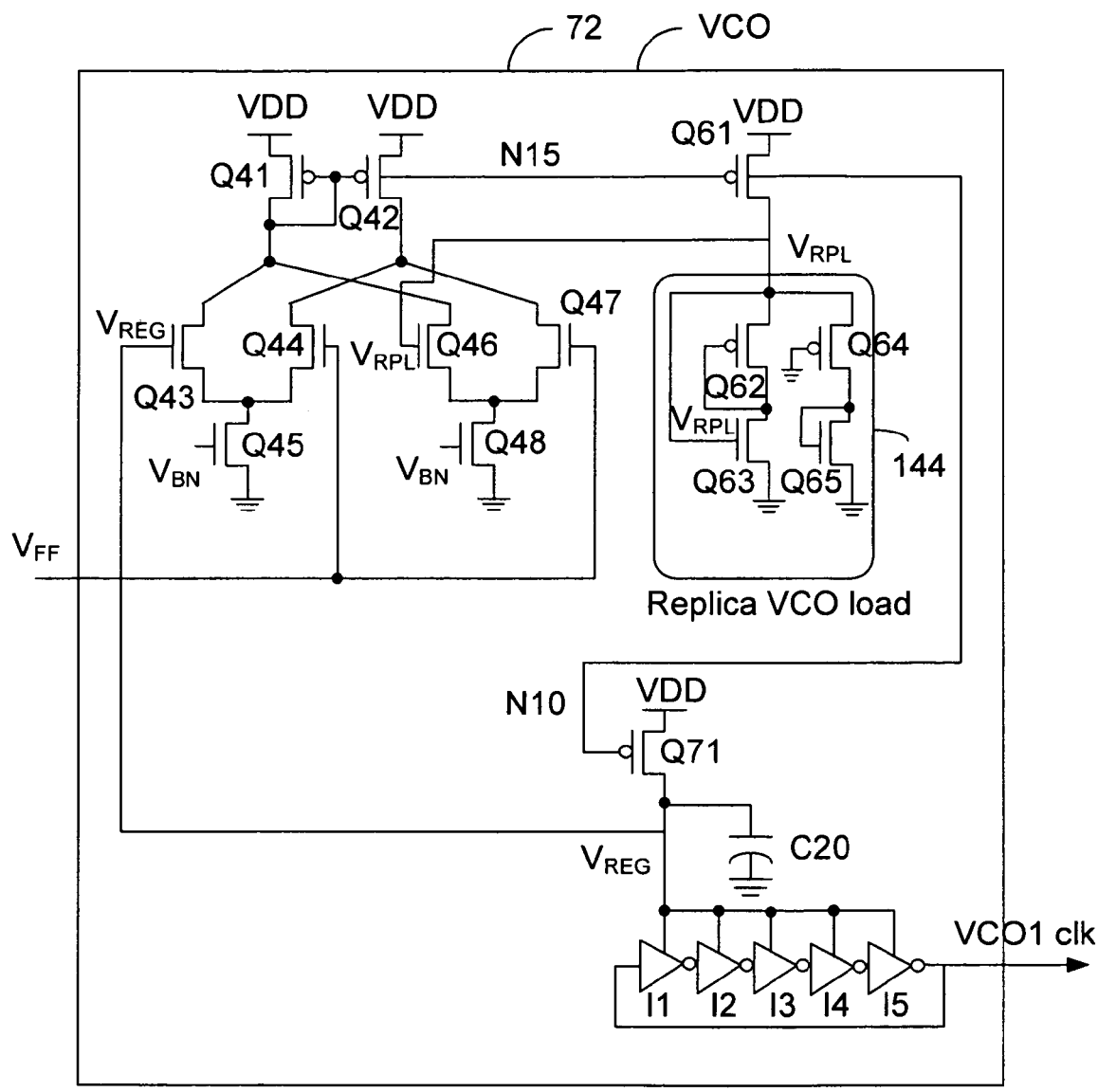
FIG. 8 is a block diagram representation of the voltage controlled oscillator of FIG. 5.

FIG. 5 illustrates embodiments of PFD 64 which provides both an up signal and a down signal to charge pump 112. In FIG. 5, CP/LF 66 of FIG. 3 includes charge pump(CP) 112 and loop filter (LP) 114. FIGS. 6, 7, and 8 provide details of some embodiments of charge pump 112, loop filter 114, and VCO 72, while other embodiments do not include these details.

FIG. 6 shows an example of charge pump 112 and its biasing circuit according to some embodiments, while other embodiments do not include these details. For adaptive bandwidth, the charge pump current is biased to track the VCO current, by settling $V_{BN}$ (biased negative) equal to $V_{CTRL1}$ through $V_{BN}$ being provided as a feedback signal to comparator 122. Also, the feedback controls $V_{BP}$ (bias positive) so that the up and down currents are matched within, for example, 2% to reduce static phase offsets. Charge pump 112 is segmented to scale the current level by ×1, ×½, and ×¼ for N·M of 1, 2, and 4, respectively The gates of P-channel metal oxide semiconductor field effect transistors (PMOSFETs) Q11, Q12, Q13, Q14, and Q15 receive the output ($V_{BP}$ signal) of comparator 122, while the gates of N-channel metal oxide semiconductor field effect transistors (NMOSFETs) Q26, Q27, Q28, Q29, and Q30 receive the $V_{BN}$ signal. PMOSFETs Q17, Q18, Q19, and Q20 receive Up signals $UP_0^*$, $UP_1^*$, $UP_2^*$, and $UP_2^*$ where $UP_0^*$, $UP_1^*$, and $UP_2^*$, are the logical inverses of $UP_0$, $UP_1$, and $UP_2$. Note that $UP_2$ has twice the weight as $UP_0$ and $UP_1$. NMOSFETs Q22, Q23, Q24, and Q25 receive Down signals $DN_0$, $DN_1$, $DN_2$, and $DN_2$. Note that $DN_2$ has twice the weight as $DN_0$ and $DN_1$. PMOSFET Q16 and NMOSFET Q21 are joined between Q11 and Q26, with the $V_{BN}$ signal between Q16 and Q21. The charge pump voltage $V_{CP}$ is provided between PMOSFETs Q17, Q18, Q19, and Q20 and NMOSFETs Q22, Q23, Q24, and Q25.

FIG. 7 shows the loop filter 114 according to some embodiments, while other embodiments do not include these details. Loop filter 114 includes a charge redistribution network 116 and a half-duty sampled-feedforward loop filter 118. Charge redistribution 116 includes switch S1 and S1\* (which is the inverse of S1). Switches S1 and S1\* alternative being opened and closed. Capacitors C11 and C12 (each having a capacitance Cp) are coupled between ground and nodes N11 and N12, respectively. Buffer 112 provides the $V_{CTRL}$ signal. When S1\* is closed and S1 is open, the $V_{CTRL}$ voltage is held in C12. When S1 is closed and S1\* is open, the $V_{CP}$ and $V_{CTRL}$ voltages combine on node N11 and are stored in C11. Each charge sharing across the switch S1 may halve the error charge stored on $V_{CP}$ at node N11. The charge redistribution network 116 may replace the role of a programmable current divider. The programmable divider generates the control signals to sequence the switches and scale down the loop gain by N×M/4 ($=2^{n+m-2}$) for N×M greater than 4.

The half-duty sampled feedforward loop filter 118 includes a switch S2 and S2\* (which is the inverse of S2). C13 and C14 (having capacitance Cp and C1, respectively) are coupled between ground and nodes N13 and N14 respectively. Loop filter 114 produces a feedforward pulse $V_{FF}$ that is half a reference cycle long and realizes the desired scaling with the reference frequency $f_{REF}$. Switches S1 and S1\* and S2 and S2\* are opened and closed to control the charge on capacitors C11, C12, C13, and C14. When S1 is closed, the charge is stored on C11 is shared with C12 and when S2 is closed, the charge on C11 is shared with C13. Switch S1\* resets voltage on C12. Switches S1 and S1\* and S2 and S2\* may be controlled by logic that received an output from the VCO circuit of FIG. 8.

FIG. 8 illustrates an inverter-based ring oscillator including a replica-compensated supply regulator 144 (including PMOSFETs Q62 and Q64 and NMOSFETs Q63 and Q65). The replica-feedback improves supply noise rejection by providing a faster feedback path that responds to supply noise. The feedforward voltage $V_{FF}$ from loop filter 114 is received by the gates of NMOSFET Q44 and Q47. When $V_{FF}$ is high (has a high voltage), Q44 and Q74 turn ON pulling the drain of Q42 down. When regulator voltage $V_{REG}$ is high, NMOSFETs Q43 also pulls down on the drain of PMOSFET Q41 and turns ON PMOSFETs Q41 and Q42. When Q44, Q47, Q42 are ON, node N15 is pulled low turning ON PMOSFET Q61. A voltage $V_{RPL}$ (replica) at the drain of Q61 turns ON NMOSFET Q46. The gates of NMOSFETs Q45 and Q48 receive $V_{BN}$ signal. This may be from the same signal as in FIG. 6 or that can be additional circuitry like that in FIG. 6 to generate the $V_{BN}$ for FIG. 8.

When the voltage of N15 is pulled down, PMOSFET Q71 turns ON, which pulls up $V_{REG}$ up and turns OFF Q43. Capacitor C20 smoothes out voltage changes. Voltage $V_{REG}$ controls the rate at which inverters I1, I2, I3, I4, and I5 oscillate and, therefore, control the frequency of the VCO1 clock signal provided from inverter I5.

Figure 9:
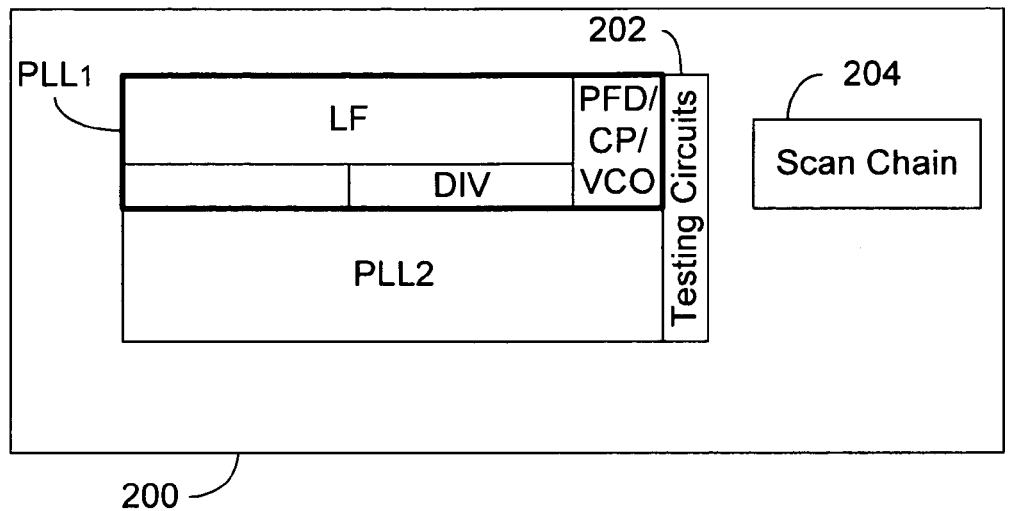
FIG. 9 is a block diagram representation of a chip layout for an example of the dual phase locked loop according to some embodiments with scan chain circuitry.

FIG. 9 illustrates a circuit layout in a sample chip 200. PLL1 includes a LF, divider (DIV), PFD, CP, and VCO. PLL2 includes the same components. Testing circuits 202 tests PLL1 and PLL2. Scan chain 204 provides external circuitry with access to portions of the PLLs through. An adaptive-bandwidth PLL was implemented in a 0.13 μm CMOS process and had the following characteristics:

Process Technology: 0.13 μm N-well 1P6M CMOS
Area: 1.1×0.46 mm²
Supply voltage: 1.2V nominal
Power dissipation: 36 mW
Reference frequency range: 2 MHz~1 GHz
Output frequency range: 2 MHz~16 GHz
Multiplication factor range: $M=2^{0~9}$
Loop bandwidth: ~1/100 of reference frequency
Jitter (M=1, 1.024 GHz) 13.10 ps, pp, 1.62 ps, rms In the example, the PLL had a wide N-selection range of $2^{1~24}$, but the example PLL locked to the reference frequency ranging from 2 MHz to 1 GHz. The subthreshold leakage in the charge pump may have limited the operation below 2 MHz. The dynamic selection of N operated successfully and the VCO oscillation frequency was confined to a narrow range of 1 to 2 GHz. The PLL could provide any multiplied frequency with $M=2^m$ as long as $M \times f_{REF}$ is no greater that 1 GHz. The measured jitter versus the reference frequency $f_{REF}$ and M confirmed that the PLL bandwidth scales with $f_{REF}$. Since the VCO phase noise dominated the output jitter in the measurement setup, the tracking jitter increased as the bandwidth decreased. By self-adapting N to $f_{OUT}$, the dual-PLL architecture keeps the VCO away from the jitter-prone, low-frequency oscillation and therefore achieves lower jitter than the fixed-N PLL. The discontinuities in the jitter trend indicated the points where N switches, and the worst-case step change in the static phase offset was 3.6% of the reference cycle. Note that other implementations of the inventions may include different details than those mentioned.

Figure 10:
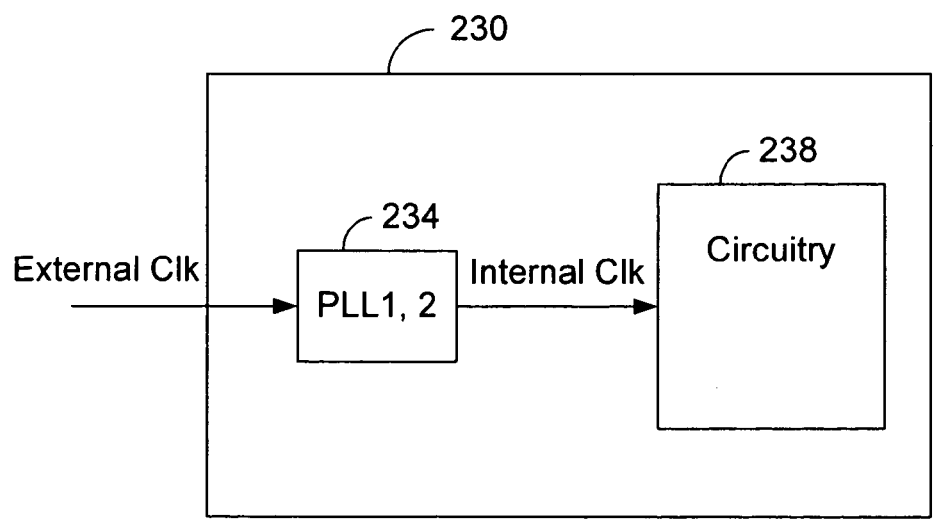
FIG. 10 is a block chip including a dual phase locked loop according to some embodiments that provides an internal clock signal to circuitry.

FIG. 10 illustrates a chip 230 with an external clock signal received by dual PLL 234, which provides an internal clock signal to circuitry 238.

The inventions are not restricted to any particular type of signaling. The input and clock signals can be single ended or differential. The clocking can be single data rate, double data rate, quad data rate, etc. In double data rate, a rising falling edge of a single clock signal may be used, or two out of phase clocks may be used. The signals may be packetized or non-packetized.

This disclosures includes various figures that are schematic in nature and do not include various details. In actual implementations, the systems and chips would include additional components that are not illustrated including between circuitry illustrated in the figures. The illustrated components may have various additional inputs and outputs. Various algorithms and methods described herein may be performed in hardware circuitry without or without the assistance of firmware or software. However, firmware and/or software may be used in overall systems in which the algorithms and methods are performed.

In FIG. 3, the division M is the same for circuits 78 and 98, but they could be different.

As used herein, the term "embodiment" refers to an implementation. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. Different references to "some embodiments" do not necessarily refer to the same "some embodiments."

If the specification states a component, feature, structure, or characteristic "may", "might", or "could" be included, that particular component, feature, structure, or characteristic is not required to be included. If the specification or claim refers to "a" structure, that does not mean there is only one of the structure.

While the invention has been described in terms of several embodiments, the invention should not limited to only those embodiments described, but can be practiced with modification and alteration within the spirit and scope of the appended claims. The description is thus to be regarded as illustrative instead of limiting.

What is claimed is:

1. A chip comprising:
   first and second sub phase lock loops (sub-PLLs) including first and second voltage controlled oscillators (VCOs) to provide first and second VCO output signals and first and second feedforward divider circuits to divide first and second frequencies of the first and second VCO output signals by first and second division factors; and
   phase locked loop (PLL) control circuitry to select the first and second division factors while considering an optimal voltage value;
   wherein the PLL control circuitry selects the first and second division factors in response to the first and second output clock signals and the first and second feedforward voltage signal inputs into the first and second VCOs.

2. The chip of claim 1, wherein the first division factor is typically different than the second division factor.

3. A chip comprising:
   first and second sub phase lock loops (sub-PLLs) including first and second voltage controlled oscillators (VCOs) to provide first and second VCO output signals and first and second feedforward divider circuits to divide first and second frequencies of the first and second VCO output signals by first and second division factors; and
   phase locked loop (PLL) control circuitry to select the first and second division factors;
   wherein the PLL control circuitry selects the first and second division factors while considering an optimal value.

4. The chip of claim 1, further comprising output signal selection circuitry to select either the divided first and second VCO output signals under the control of the phase locked loop control circuitry.

5. A chip comprising:
   first and second sub phase lock loops (sub-PLLs) including first and second voltage controlled oscillators (VCOs) to provide first and second VCO output signals and first and second feedforward divider circuits to divide first and second frequencies of the first and second VCO output signals by first and second division factors; and
   phase locked loop (PLL) control circuitry to select the first and second division factors while considering an optimal voltage value;
   wherein the first division factor is equal to 2 raised to an integer power and the second first division factor is equal to 2 raised to an integer power, and wherein the integer for the first division factor is typically different than the integer for the second division factor.

6. The chip of claim 5, wherein the integers of the first sub-PLL are even integers and the integers of the second sub-PLL are odd integers.

7. The chip of claim 1, wherein while one sub-PLL is provide the output, PLL control circuitry may change the division factor for the other sub-PLL.

8. A chip comprising:
   first and second sub phase lock loops (sub-PLLs) including first and second voltage controlled oscillators (VCOs) to provide first and second VCO output signals and first and second feedforward divider circuits to divide first and second frequencies of the first and second VCO output signals by first and second division factors; and
   phase locked loop (PLL) control circuitry to select the first and second division factors while considering an optimal voltage value;
   wherein the first and second sub-PLLs include:
      first and second phase frequency detectors; and
      first and second feedback divider circuits to divide the frequency of divided first and second VCO output signals and provide them to the first and second phase frequency detectors.

9. A method comprising:
   providing first and second voltage controlled oscillators (VCOs) of first and second sub phase lock loops (sub-PLLs) with voltage control signals;
   outputting first and second VCO output signals and first and second feedforward divider circuits from the first and second VCOs;
   dividing first and second frequencies of the first and second VCO output signals by first and second division factors; and
   selecting the first and second division factors while considering an optimal voltage value;
   wherein the PLL control circuitry selects the first and second division factors in response to the first and second output clock signals and the first and second feedforward feedforward voltage signal inputs into the first and second VCOs.

10. The method of claim 9, further comprising selecting the output of the first or the second sub-PLLs as a PLL output signal.

11. A method comprising:
    providing first and second voltage controlled oscillators (VCOs) of first and second sub phase lock loops (sub-PLLs) with voltage control signals;
    outputting first and second VCO output signals and first and second feedforward divider circuits from the first and second VCOs;
    dividing first and second frequencies of the first and second VCO output signals by first and second division factors; and
    selecting the first and second division factors;
    wherein PLL control circuitry selects the first and second division factors while considering an optimal voltage value.

12. The method of claim 11, wherein the first division factor is typically different than the second division factor.

13. A chip comprising:
    at least one conductor carrying an input clock signal;
    a dual phase locked loop (dual-PLL) including:
    first and second sub phase lock loops (sub-PLLs) including first and second voltage controlled oscillators (VCOs) to provide first and second VCO output signals and first and second feedforward divider circuits to divide first and second frequencies of the first and second VCO output signals by first and second division factors; and
    phase locked loop control circuitry to select the first and second division factors while considering an optimal voltage value;
    wherein the PLL control circuitry selects the first and second division factors in response to the first and second output clock signals and the first and second feedforward voltage signal inputs into the first and second VCOs.

14. The chip of claim 13, wherein the first division factor is typically different than the second division factor.

15. A chip comprising:
    at least one conductor carrying an input clock signal;
    a dual phase locked loop (dual-PLL) including:
    first and second sub phase lock loops (sub-PLLs) including first and second voltage controlled oscillators (VCOs) to provide first and second VCO output signals and first and second feedforward divider circuits to divide first and second frequencies of the first and second VCO output signals by first and second division factors; and
    phase locked loop control circuitry to select the first and second division factors;
    wherein the PLL control circuitry selects the first and second division factors while considering an optimal voltage value.

16. The chip of claim 13, further comprising output signal selection circuitry to select either the divided first and second VCO output signals under the control of the phase locked loop control circuitry.

17. A chip comprising:
    at least one conductor carrying an input clock signal;
    a dual phase locked loop (dual-PLL) including:
    first and second sub phase lock loops (sub-PLLs) including first and second voltage controlled oscillators (VCOs) to provide first and second VCO output signals and first and second feedforward divider circuits to divide first and second frequencies of the first and second VCO output signals by first and second division factors; and
    phase locked loop control circuitry to select the first and second division factors while considering an optimal voltage value;
    wherein the first division factor is equal to 2 raised to an integer power and the second first division factor is equal to 2 raised to an integer power, and wherein the integer for the first division factor is typically different than the integer for the second division factor.

18. The chip of claim 3, further comprising output signal selection circuitry to select either the divided first and second VCO output signals under the control of the phase locked loop control circuitry.

19. The chip of claim 5, further comprising output signal selection circuitry to select either the divided first and second VCO output signals under the control of the phase locked loop control circuitry.

20. The chip of claim 8, further comprising output signal selection circuitry to select either the divided first and second VCO output signals under the control of the phase locked loop control circuitry.

21. The chip of claim 3, wherein while one sub-PLL is provided to an ouput, PLL control circuitry may change the division factor for the other sub-PLL.

22. The chip of claim 5, wherein while one sub-PLL is provided to an output, PLL control circuitry may change the division factor for the other sub-PLL.

23. The chip of claim 8, wherein while one sub-PLL is provided to an output, PLL control circuitry may change the division factor for the other sub-PLL.

24. The chip of claim 15, further comprising output signal selection circuitry to select either the divided first and second VCO output signals under the control of the phase locked loop control circuitry.

25. The chip of claim 17, further comprising output signal selection circuitry to select either the divided first and second VCO output signals under the control of the phase locked loop control circuitry.

* * * * *